(12) United States Patent
Cao et al.

(10) Patent No.: US 10,712,761 B2
(45) Date of Patent: Jul. 14, 2020

(54) MULTI-BIT DIGITALLY CONTROLLED ACCURATE CURRENT SOURCE CIRCUIT

(71) Applicant: AmpliPHY Technologies Limited, Hangzhou (CN)

(72) Inventors: Tianlin Cao, Hangzhou (CN); Yichao He, Hangzhou (CN); Jie Lou, Hangzhou (CN); Qingping Li, Hangzhou (CN); Zhuoyuan Li, Hangzhou (CN)

(73) Assignee: AMPLIPHY TECHNOLOGIES LIMITED, Hangzhou (CN)

( * ) Notice: Subject to any disclaimer, the term of this patent is extended or adjusted under 35 U.S.C. 154(b) by 0 days.

(21) Appl. No.: 16/246,571

(22) Filed: Jan. 14, 2019

(65) Prior Publication Data
US 2020/0089265 A1      Mar. 19, 2020

(30) Foreign Application Priority Data

Sep. 18, 2018   (CN) .......................... 2018 1 1088957

(51) Int. Cl.
*G05F 3/24* (2006.01)
(52) U.S. Cl.
CPC ...................... *G05F 3/24* (2013.01)
(58) Field of Classification Search
CPC .......................................................... G05F 3/24

USPC .......................................... 323/315, 313, 907
See application file for complete search history.

(56) References Cited

U.S. PATENT DOCUMENTS

| 4,453,121 A * | 6/1984 | Noufer .................... G05F 3/247 323/226 |
| 2005/0052200 A1 * | 3/2005 | Nguyen ............. H03K 19/0005 326/30 |

* cited by examiner

*Primary Examiner* — Thienvu V Tran
*Assistant Examiner* — Peter M Novak
(74) *Attorney, Agent, or Firm* — Bayramoglu Law Offices LLC

(57) ABSTRACT

This invention provides a multi-bit digitally controlled accurate current source circuit including a reference current detection unit, a voltage buffer unit, a digital logic control unit, a switch array unit, and a current source array unit. The reference current detection unit generates a first bias voltage according to a reference current; the voltage buffer unit receives the first bias voltage, and generate a buffer voltage accordingly; the digital logic control unit receives the buffer voltage, and generate a digital control signal accordingly; the switch array unit receives the digital control signal, and generate on-off signals accordingly; and the current source array unit receives and responds to the on-off signals so as to control turn-on and turn-off of the current sources in the current source array unit. In this invention, by adding only one voltage buffer, a cascode current source if formed, and an area saving accurate current source is realized.

10 Claims, 2 Drawing Sheets

MULTI-BIT DIGITALLY CONTROLLED ACCURATE CURRENT SOURCE CIRCUIT

CROSS-REFERENCE TO RELATED APPLICATIONS

This Non-provisional application claims priority under 35 U.S.C. § 119(a) on Patent Application No(s). 201811088957.0 filed in People's Republic of China on Sep. 18, 2018, the entire contents of which are hereby incorporated by reference.

TECHNICAL FIELD

This invention relates to a technical field of a circuit design and, more particularly, to a multi-bit digitally controlled accurate current source circuit.

BACKGROUND

Multi-bit digitally controlled current source circuits are widely used in a variety of integrated circuits, such as a current mode digital to analog converter, a current mode laser driver, and various CML circuits.

The multi-bit digitally controlled current source generally consists of a digital logic control circuit, a switch array, and a current source array. A flow chart of an n-bit digital control current source is shown in FIG. 1. An output bus of the digital logic control circuit controls turn-on or turn-off of each switch in the switch array so as to control an output current of the current source array.

FIG. 2 shows a conventional n-bit current source circuit, and both the switch array and current source array are implemented by n-channel metal oxide semiconductor (NMOS) transistor. The NMOS transistor mn receives a reference current $i_{ref}$ and generates a bias voltage V_bias. Each current source branch in the current source array includes $2^i$ current source units. The i-th (i=0, 1, ..., n−1) current source branch can generate $2^i \cdot i_{ref}$ current under the control of V_bias. The digital control circuit outputs an n-bit control code, when $B_i$ (i=0, 1, ..., n−1) is logic 1, $Vb_i$ is equal to a digital power supply voltage DVDD, at this time, the i-th current source branch is turned on; and when $B_i$ (i=0, 1, ..., n−1) is logic 0, $Vb_i$ is equal to the ground level VSS, at this time, the i-th current source branch is turned off.

The main drawback of this topology is that the current source array's output current varies with its output voltage Vout due to the channel length modulation effect. When Vout is not equal to V_bias, the output current will deviate from a designed value, and the greater the difference between Vout and V_bias, the greater the error of the output current. If it is necessary to increase the output current accuracy, it is necessary to increase the channel length of the current mirror unit, or to use a cascode current source as shown in FIG. 3. Both of the above-mentioned two improvements increase the area of the chip and increase significantly as the bit number of n of the current source increases.

SUMMARY

This invention provides a multi-bit digitally controlled accurate current source circuit to solve the above-mentioned problems.

To solve the above-mentioned problems, an embodiment of this invention provides a multi-bit digitally controlled accurate current source circuit including:

a reference current detection unit, coupled with a reference current source and configured to generate a first bias voltage according to a reference current of the reference current source;

a voltage buffer unit, coupled with the reference current detection unit and configured to receive the first bias voltage of the reference current detection unit and to generate a buffer voltage according to the first bias voltage at the same time;

a digital logic control unit, coupled with the voltage buffer unit and configured to receive the buffer voltage of the voltage buffer unit and to generate a digital control signal according to the buffer voltage at the same time;

a switch array unit, coupled with the digital logic control unit and configured to receive the digital control signal of the digital logic control unit and to generate an on-off signal controlling a current source array unit according to the digital control signal at the same time; and the current source array unit, coupled with the switch array unit and the reference current detection unit, and configured to receive and respond to the on-off signal of the switch array unit so as to control turn-on and turn-off of a current source in the current source array unit.

As an implement way, the reference current detection unit may include:

a resistor, including a positive end and a negative end, the positive end being coupled with an output end of the reference current source and an input end of the voltage buffer unit, and the negative end being coupled with a drain end of a first n-channel metal oxide semiconductor (NMOS) transistor and a gate end of a second NMOS transistor;

the first NMOS transistor, the drain end of the first NMOS transistor being coupled with the negative end of the resistor, a gate end of the first NMOS transistor being coupled with the positive end of the resistor and the input end of the voltage buffer unit, and a source end of the first NMOS transistor being coupled with a drain end of the second NMOS transistor; and the second NMOS transistor, the drain end of the second NMOS transistor being coupled with the source end of the first NMOS transistor, the gate end of the second NMOS transistor being coupled with the negative end of the resistor and a gate end of the current source in the current source array unit, and a source end of the second NMOS transistor is grounded.

As an implement way, the switch array unit may include sub-switches the number of which is powers of 2, and the current source array unit may include current sources the number of which corresponds to the number of the sub-switches.

As an implement way, a plurality of sub-switches may adopt NMOS transistors identical to the first NMOS transistor. Gate ends of the NMOS transistors may be coupled with an output end of the digital logic control unit, drain ends of the NMOS transistors may be coupled with an output end of the accurate current source circuit, and source ends of the NMOS transistors may be coupled with the current sources.

As an implement way, a plurality of current sources may adopt NMOS transistors identical to the second NMOS transistor. Drain ends of the NMOS transistors may be coupled with the sub-switches, gate ends of the NMOS transistors may be coupled with the negative end of the resistor and the gate end of the second NMOS transistor, and source ends of the NMOS transistors may be grounded.

As an implement way, a voltage gain of the voltage buffer unit may be 1.

Compared with the prior art, a beneficial effect of this invention is as follows. Compared with the conventional multi-bit current sources, in this invention, by adding only one voltage buffer, the cascode current source array is formed, and the area of the accurate current source is greatly reduced.

Figure 1:
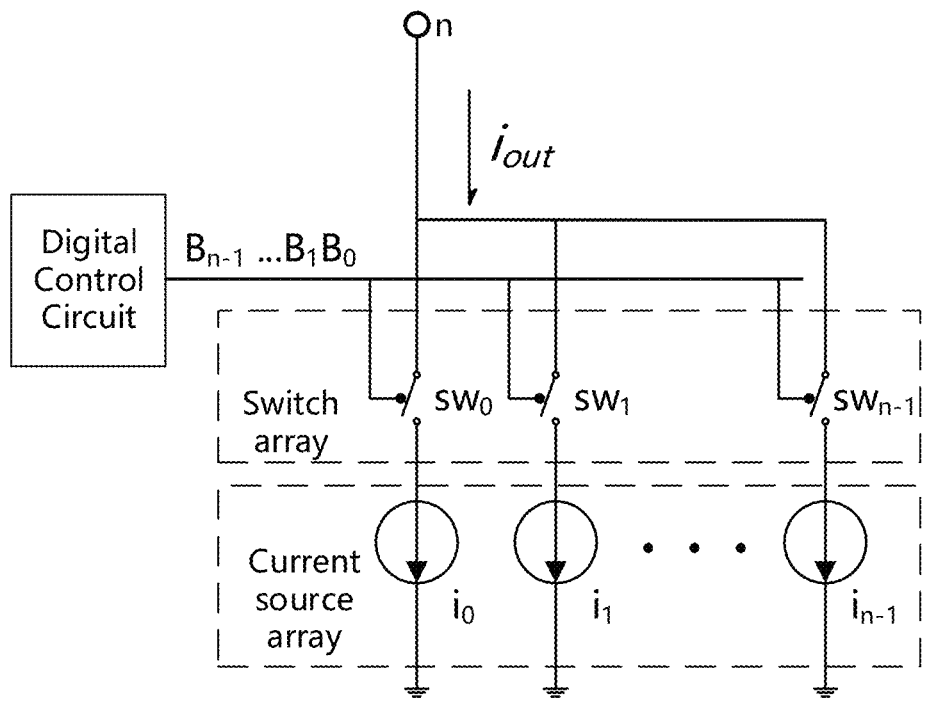
FIG. 1 is a flow chart of an existing multi-bit digitally controlled current source.
Figure 2:
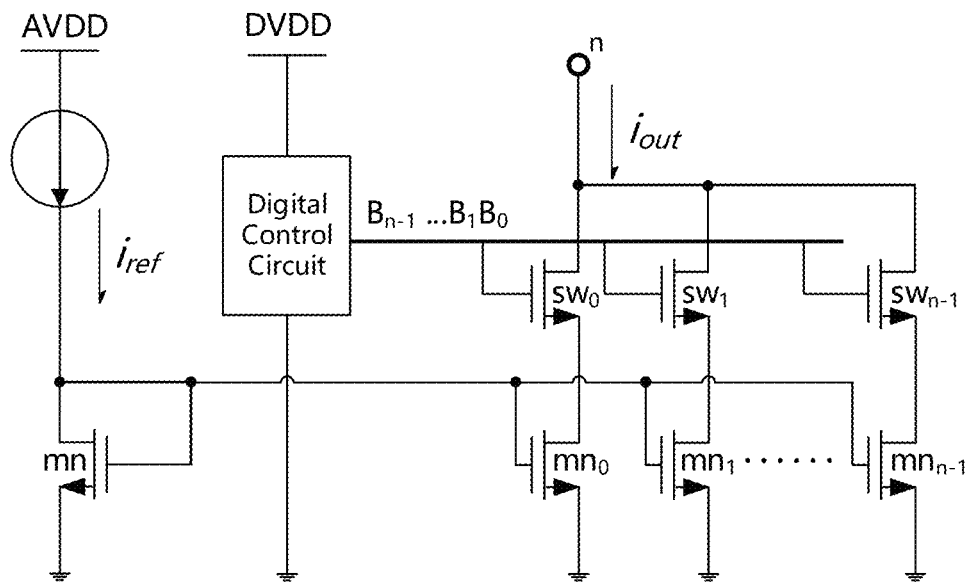
FIG. 2 is a circuit diagram of the existing multi-bit digitally controlled current source circuit.
Figure 3:
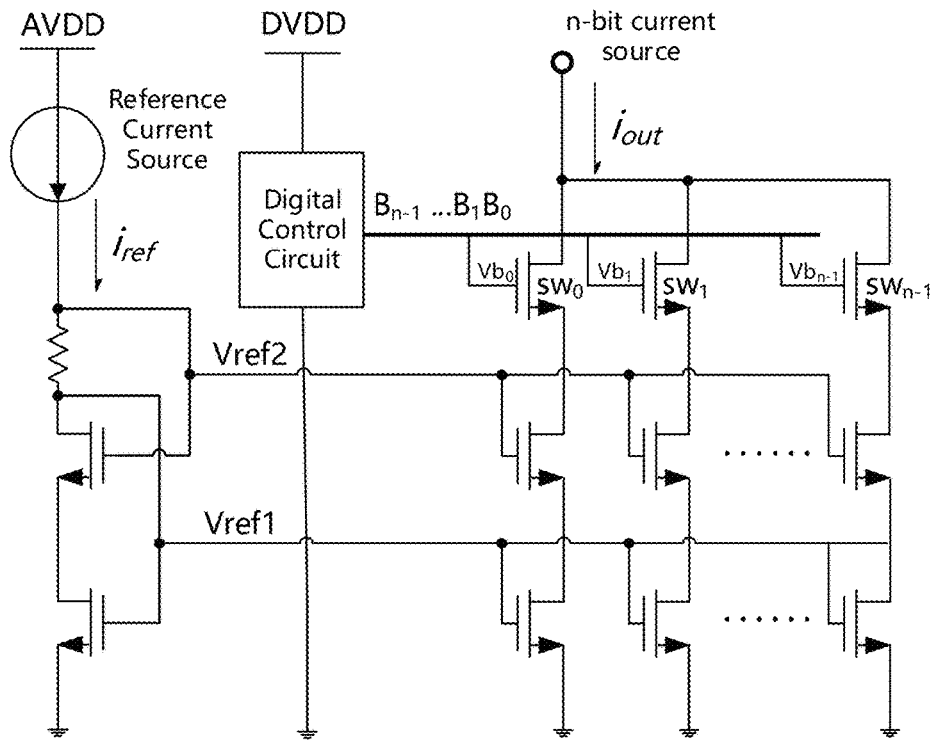
FIG. 3 is a circuit diagram of an existing cascode current source circuit.

FIGURE REFERENCE NUMERALS 1. reference current detection unit; 2. voltage buffer unit; 3. digital logic control unit; 4. switch array unit; and 5. current source array unit.

DETAILED DESCRIPTION OF THE EMBODIMENTS

The above and other technical features and advantages of this invention will be clearly and completely described combining with the accompanying drawings hereinafter. Apparently, the described embodiments are merely parts of the embodiments of this invention instead of all the embodiments.

Figure 4:
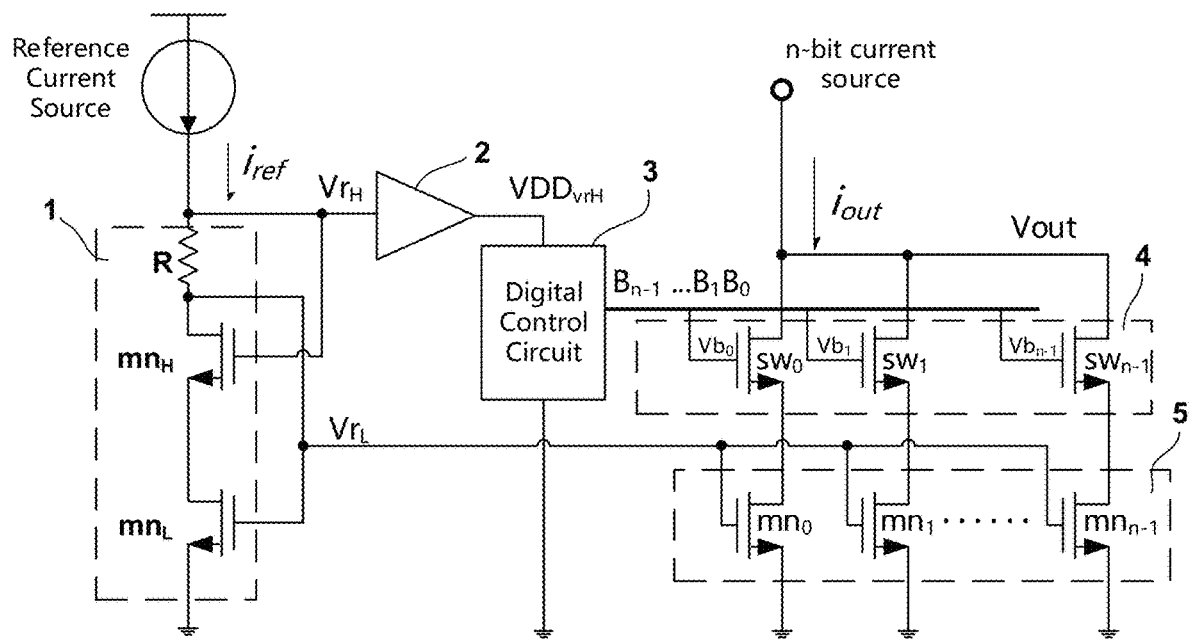
FIG. 4 is a circuit diagram of the multi-bit digitally controlled accurate current source circuit according to this invention.

As shown in FIG. 4, a multi-bit digitally controlled accurate current source circuit, includes a reference current detection unit 1, a voltage buffer unit 2, a digital logic control unit 3, a switch array unit 4, and a current source array unit 5. The reference current detection unit 1 is coupled with the reference current source and configured to generate a first bias voltage according to a reference current of the reference current source; the voltage buffer unit 2 is coupled with the reference current detection unit 1 and configured to receive the first bias voltage of the reference current detection unit 1, at the same time, a buffer voltage is generated according to the first bias voltage; the digital logic control unit 3 is coupled with the voltage buffer unit 2 and configured to receive the buffer voltage of the voltage buffer unit 2, at the same time, a digital control signal is generated according to the buffer voltage; the switch array unit 4 is coupled with the digital logic control unit 3 and configured to receive the digital control signal of the digital logic control unit 3, at the same time, an on-off signal controlling the current source array unit 5 is generated according to the digital control signal; and the current source array unit 5 is coupled with the switch array unit 4 and the reference current detection unit 1, and configured to receive and respond to the on-off signal of the switch array unit 4 so as to control turn-on and turn-off of a current source in the current source array unit 5.

The reference current detection unit 1 includes a resistor R, a first NMOS transistor $mn_H$, and a second NMOS transistor $mn_L$. A positive end of the resistor R is coupled with an output end of the reference current source and an input end of the voltage buffer unit 2, and a negative end of the resistor R is coupled with a drain end of the first NMOS transistor $mn_H$ and a gate end of the second NMOS transistor $mn_L$; the drain end of the first NMOS transistor $mn_H$ is coupled with the negative end of the resistor, a gate end of the first NMOS transistor $mn_H$ is coupled with the positive end of the resistor and the input end of the voltage buffer unit 2, and a source end of the first NMOS transistor $mn_H$ is coupled with a drain end of the second NMOS transistor $mn_L$; and the drain end of the second NMOS transistor $mn_L$ is coupled with the source end of the first NMOS transistor $mn_H$, the gate end of the second NMOS transistor $mn_L$ is coupled with the negative end of the resistor and a gate end of the current source in the current source array unit 5, and the source end of the second NMOS transistor $mn_L$ is grounded.

The switch array unit 4 can include sub-switches with any number. In this embodiment, the switch array unit 4 includes 2i sub-switches identical to the first NMOS transistor $mn_H$, $sw_i$ (i=0, 1, ..., n-1). Gate ends of the sub-switches are coupled with an output end of the digital logic control unit 3, drain ends of the sub-switches are coupled with an output end of n-bit current source, and source ends of the sub-switches are coupled with corresponding current sources in the current source array unit 5, respectively.

The current source array unit 5 includes current sources having the same number with the sub-switches and being identical to the second NMOS transistor $mn_L$, $mn_i$ (i=0, 1, ..., n-1). Drain ends of the current sources are coupled with source ends of the sub-switches, gate ends of the current sources are coupled with the negative end of the resistor, the drain end of the first NMOS transistor $mn_H$, and the gate end of the second NMOS transistor $mn_L$, and source ends of the current sources are grounded.

In this embodiment, a voltage gain of the voltage buffer unit 2 is 1.

The working principle of the multi-bit digitally controlled accurate current source circuit of this invention is as follows. According to the reference current $i_{ref}$ provided by the reference current source, the first bias voltage VrH and the bias voltage VrL are generated. The buffer voltage $VDD_{vrH}$ is generated by the voltage buffer according to the first bias voltage VrH, and $VDD_{vrH}$ is identical to VrH. The bias voltage VrL is directly connected with gate ends of the current sources in the current source array, and the buffer voltage $VDD_{vrH}$ outputted by the voltage buffer supplies power for the digital logic control unit 3. When an output code $B_i$ of the digital logic control unit 3 is logic '1', the voltage is equal to $VDD_{vrH}$; and when $B_i$ is logic '0', the voltage is equal to the ground level. The output of the digital logic control unit 3 controls gate ends of the sub-switches in the switch array. When $B_i$ is logic '1', the current source of the i-th current source branch is turned on. At this time, voltages at gate ends of $sw_i$ and $mn_i$ are the same with voltages at gate ends of $mn_H$ and $mn_L$, respectively. The dimensions of $sw_i$ and $mn_i$ are 2^i times $mn_H$ and $mn_L$, respectively. Therefore, $sw_i$ and $mn_i$ form a cascode current source, and the current of the i-th current source branch is accurate $2^i \cdot i_{ref}$. When $B_i$ is logic '0', the current source of i-th current source branch is turned off.

Compared with the conventional multi-bit current source, in this invention, by adding only one voltage buffer, the cascode current source array is formed, and the area of the accurate current source is greatly reduced.

The specific embodiments described above further explain objectives, technical solutions, and beneficial effects of this invention, and it is understood that the above-mentioned description is only the embodiment of this invention and is not intended to limit the protection scope of this invention. It should be noted that for those skilled in the art, any made modifications, equivalent replacement, improvements, etc. within the spirit and principle of this invention are intended to be included in the protection scope of this invention.

What is claimed is:

1. A multi-bit digitally controlled accurate current source circuit, comprising:
 a reference current detection unit having a resistor, coupled with a reference current source and configured to generate a first bias voltage according to a reference current of the reference current source, wherein the generated first bias voltage comprises an unchanging first bias voltage;
 a voltage buffer unit, coupled with the reference current detection unit and configured to receive the first bias voltage of the reference current detection unit and to generate a buffer voltage according to the first bias voltage at the same time, wherein the generated buffer voltage comprises an unchanging buffer voltage;
 a digital logic control unit, coupled with the voltage buffer unit and configured to receive the buffer voltage of the voltage buffer unit and to generate a digital control signal according to the buffer voltage at the same time, wherein the digital logic control unit is powered by the buffer voltage of the voltage buffer unit;
 a switch array unit, coupled with the digital logic control unit and configured to receive the digital control signal of the digital logic control unit and to generate an on-off signal controlling a current source array unit according to the digital control signal at the same time; and
 the current source array unit, coupled with the switch array unit and the reference current detection unit, and configured to receive and respond to the on-off signal of the switch array unit so as to control turn-on and turn-off of a current source in the current source array unit.

2. The multi-bit digitally controlled accurate current source circuit according to claim 1, wherein a voltage gain of the voltage buffer unit is 1.

3. The multi-bit digitally controlled accurate current source circuit according to claim 1, wherein the reference current detection unit comprises:
 the resistor, comprising a positive end and a negative end, the positive end being coupled with an output end of the reference current source and an input end of the voltage buffer unit, and the negative end being coupled with a drain end of a first n-channel metal oxide semiconductor (NMOS) transistor and a gate end of a second NMOS transistor;
 the first NMOS transistor, the drain end of the first NMOS transistor being coupled with the negative end of the resistor, a gate end of the first NMOS transistor being coupled with the positive end of the resistor and the input end of the voltage buffer unit, and a source end of the first NMOS transistor being coupled with a drain end of the second NMOS transistor; and
 the second NMOS transistor, the drain end of the second NMOS transistor being coupled with the source end of the first NMOS transistor, the gate end of the second NMOS transistor being coupled with the negative end of the resistor and a gate end of the current source in the current source array unit, and a source end of the second NMOS transistor is grounded.

4. The multi-bit digitally controlled accurate current source circuit according to claim 3, wherein a voltage gain of the voltage buffer unit is 1.

5. The multi-bit digitally controlled accurate current source circuit according to claim 3, wherein the switch array unit comprises sub-switches the number of which is powers of 2, and the current source array unit comprises current sources the number of which corresponds to the number of the sub-switches.

6. The multi-bit digitally controlled accurate current source circuit according to claim 5, wherein a voltage gain of the voltage buffer unit is 1.

7. The multi-bit digitally controlled accurate current source circuit according to claim 5, wherein a plurality of sub-switches adopt NMOS transistors identical to the first NMOS transistor, gate ends of the NMOS transistors are coupled with an output end of the digital logic control unit, drain ends of the NMOS transistors are coupled with an output end of the accurate current source circuit, and source ends of the NMOS transistors are coupled with the current source.

8. The multi-bit digitally controlled accurate current source circuit according to claim 7, wherein a voltage gain of the voltage buffer unit is 1.

9. The multi-bit digitally controlled accurate current source circuit according to claim 5, wherein a plurality of current sources adopt NMOS transistors identical to the second NMOS transistor, drain ends of the NMOS transistors are coupled with the sub-switches, gate ends of the NMOS transistors are coupled with the negative end of the resistor and the gate end of the second NMOS transistor, and source ends of the NMOS transistors are grounded.

10. The multi-bit digitally controlled accurate current source circuit according to claim 9, wherein a voltage gain of the voltage buffer unit is 1.

* * * * *